US006519740B1

United States Patent
(12) United States Patent
Mårtensson et al.

(10) Patent No.: US 6,519,740 B1
(45) Date of Patent: Feb. 11, 2003

(54) BIT DETECTION METHOD IN A RADIO COMMUNICATIONS SYSTEM

(75) Inventors: Jan Mårtensson, Bromma (SE); Johan Backman, Stockholm (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 09/079,853

(22) Filed: May 15, 1998

(30) Foreign Application Priority Data

May 20, 1997 (SE) .............................................. 9701866

(51) Int. Cl.[7] ............................ H04L 1/08; H04L 1/22; H04L 1/24; G06F 11/08; H03M 13/00

(52) U.S. Cl. ........................ 714/822; 714/780; 714/797

(58) Field of Search ................................ 714/822, 780, 714/797

(56) References Cited

U.S. PATENT DOCUMENTS

| | | | | |
|---|---|---|---|---|
| 3,863,215 A | * | 1/1975 | McGrogan, Jr. | 714/822 |
| 4,132,975 A | * | 1/1979 | Koike | 714/797 |
| 4,400,811 A | * | 8/1983 | Brown et al. | 714/822 |
| 4,518,947 A | * | 5/1985 | Poston et al. | 341/81 |
| 4,943,965 A | | 7/1990 | Machida et al. | 371/36 |
| 5,432,778 A | | 7/1995 | Minde et al. | 370/95.3 |
| 5,463,646 A | | 10/1995 | Dillon et al. | 371/69.1 |
| 5,502,713 A | | 3/1996 | Lagerqvist et al. | 370/71 |
| 5,710,784 A | * | 1/1998 | Kindred et al. | 375/262 |
| 6,215,762 B1 | * | 4/2001 | Dent | 370/208 |

FOREIGN PATENT DOCUMENTS

| | | |
|---|---|---|
| EP | 0 798 888 | 10/1997 |
| JP | 1-151332 | 6/1989 |

* cited by examiner

*Primary Examiner*—Albert Decady
*Assistant Examiner*—Joseph D. Torres

(57) ABSTRACT

The present invention relates generally to the detection of bits which are protected by repetition, and which, along with their repetitions, have associated soft values available which give a measurement of the reliability of their received values. In particular, the present invention may be used in speech encoding in the GSM mobile communications system, and more particularly to the detection of those class 2 bits called pulse5 bits which are not protected with channel coding. In enhanced full rate (EFS) transmission in GSM there are 4 bits called pulse5 bits. These pulse5 bits are duplicated twice, giving three bits for each original bit, for a total of twelve pulse5 bits. These bits have associated soft values, a probability measure of their reliability, that are produced by the equalizer. These associated soft values are then used in the present invention to improve detection of these pulse5 bits over the state of the art which detects the pulses bits only using a majority decision among the 3 bits generated, without using their associated soft values.

9 Claims, 8 Drawing Sheets

Choose Those Bits Equal to 0 (410)
Add Their Soft Values to Get SumSoft0 (420)
Choose Those Bits Equal to 1 (430)
Add Their Soft Values to Get SumSoft1 (440)
SumSoft0>SumSoft1? (450) Yes → bit=0 (460); No
SumSoft0<SumSoft1? (470) Yes → bit=1 (480); No
Choose Highest Soft Value (490)
Majority of Bits Having Highest Soft Value? (491) Yes → bit=bit Value of bit Having Highest Soft Value (492); No
Choose Next Highest Soft Value (493)

BIT DETECTION METHOD IN A RADIO COMMUNICATIONS SYSTEM

FIELD OF THE INVENTION

The present invention relates generally to the detection of bits which are protected by repetition, and which, along with their repetitions, have soft values available which give a measurement of the reliability of their received values. In particular, the present invention may be used in the decoding process of speech parameters in the GSM mobile communications system, and more particularly to the detection of those class 2 bits called pulse5 bits in enhanced full-rate speech (EFS) which are not protected with channel coding.

RELATED ART

In GSM, the speech is digitised and sliced into 20 ms pieces. A 20 ms speech frame is designed to contain 260 bits which is divided into three blocks of bits, class 1*a*, class 1*b*, and class 2, according to their level of protection. A speech frame sent every 20 ms gives a net bit rate of 13 kbit/s. The normal mode of transmission in GSM is called full rate speech (FS).

Another option in GSM is enhanced full rate speech (EFS), which is more efficient than ordinary full rate speech (FS). Although FS uses 260 bits to encode various speech parameters, EFS only needs 244 bits to encode the same information. Thus, in comparison to FS, EFS has 16 extra bits that can be used to protect some of the other bits. An 8 bit cyclic redundancy check (CRC) is used for error detection among some of the bits (i.e. the class 1*b* bits), while the other 8 of the 16 bits are used to protect some of the other bits known as pulse5 bits.

In EFS there are certain bits known as pulse5 bits generated by the speech encoder. These bits are not protected with channel coding, although they are protected by repeating them. In each speech frame there are four pulse5 bits that are protected by repeating each pulse bit two times, which gives a total of twelve (4×(1 pulse5 bit+2 repetitions)) pulse5 bits in each speech frame.

The system must detect the values of each of the bits transmitted. Today, a pulse5 bit is detected by means of a majority decision. Since each pulse5 bit is repeated twice, a majority decision is made among the three resulting bits; if two of the three bits are 0s then the decision will be taken that the value of the pulse5 bit as transmitted was equal to a 0,The GSM specification itself does not mention a particular detection method, but merely requires that each pulse5 bit must be repeated.

The prior art method still presents a problem, however, since it doesn't make any use of the "soft" values provided in the equalizer. These values provide a measure of the reliability of the bits received. A better method is proposed by the present invention that makes use of certain soft values provided by the equalizer.

In current GSM systems, a Viterbi equalizer is used which provides certain soft values about the received bits in addition to the bits themselves. The output of the equalizer gives both the value of the bit as received, and a measure of its reliability. The measure of the reliability is in the form of a probability that the bit is indeed equal to 0 or 1. By ignoring the soft values, present methods are not as reliable as that proposed by the present invention.

For example, in the present state of the art systems a majority decision is taken when two bits have the same value (e.g. two 1s) in spite of the fact that their reliability might be low (i.e. low soft values). In addition, the reliability of the third bit, which can be of another value (e.g. 0), might be high. In this example, the state of the art would detect a value of 1, while the present invention would detect a value of 0, because a 0 was the most probable bit that was repeated according to the soft values.

These soft values are currently available in the decoder in present systems where they are normally used in the channel decoding process. The present invention proposes modifying the structure of current systems to then make use of these soft values to make a soft decision on the value of the pulse5 bits. Simulations of this use of soft values instead of majority decision has shown an improved C/I and SNR performance of approximately 4.5 dB in the detection of these pulse5 bits.

SUMMARY OF THE INVENTION

As has been seen, there currently exists a problem with the present methods of using a simple majority decision to determine the value of the pulse5 bits in a GSM speech frame. The present invention aims to solve this problem by using those soft values provided by the equalizer. In current systems these soft values are used only for channel decoding and are not then available for use in detection of the pulse5 bits. Because they can provide a measure of the reliability of the bits from the equalizer, they can increase the reliability of the decision taken that determines the value of the pulse5 bits.

Each speech frame in enhanced full rate (EFS) speech uses 244 of 260 available bits for encoding speech, leaving 16 bits available for protection of other bits. Among the 260 bits are 4 bits called pulse5 bits. These 4 bits are each repeated twice, resulting in 12 total bits. For each of four total pulse5 bits there are three soft values, the soft value of the original bit plus the soft values of two repetitions.

The equalizer produces a soft value for each of these three bits. In the first step of the method the bits whose values are equal to 0 are chosen. Then the soft values of these bits are added together to yield a value called SumSoft0, which will thereby be the sum of the soft values for all the bits equal to 0 for a given pulse5 bit.

The next step in the present invention is to similarly choose the bits whose values are equal to 1. Then the soft values of these bits are added together to yield a value called SumSoft1, which will thereby be the sum of the soft values for all the bits equal to 1 for a given pulse5 bit.

After the values for SumSoft0 and SumSoft1 are determined, a decision is taken according to the algorithm below:

if SumSoft0>SumSoft1 then
  pulse5_bit:=0
else if SumSoft0<SumSoft1 then
  pulse5_bit:=1
else
  an ordinary majority decision takes place.

The present invention improves over the performance of present systems in the detection of pulse5 bits. A normal majority decision as performed by current systems can only correct one bit error. If two bit errors occur out of the three bits allocated for each pulse5 bit, then an incorrect decision will be taken. By using the soft values for each of these bits, as a measure of their probability and reliability, performance is improved. Test simulations have indicated an improved C/I and SNR performance of approximately 4.5 dB in the detection of these bits.

Although the preferred embodiment of the present invention focuses primarily on the detection of pulse5 bits in GSM systems, the algorithm may be used in broader applications. The use of repetition to protect bits, as is done with pulse5 bits, is not often used, due to its inefficiency. However, the additional availability of "soft" values for the bit and its repetitions makes possible the use of the present invention for detection of any bit which is protected by repetition and which has "soft" values available.

BRIEF DESCRIPTION OF THE DRAWINGS

The present invention will now be described in more detail with reference to preferred embodiments of the present invention, given only by way of example, and illustrated in the accompanying drawings, in which.

DETAILED DESCRIPTION

Figure 1:
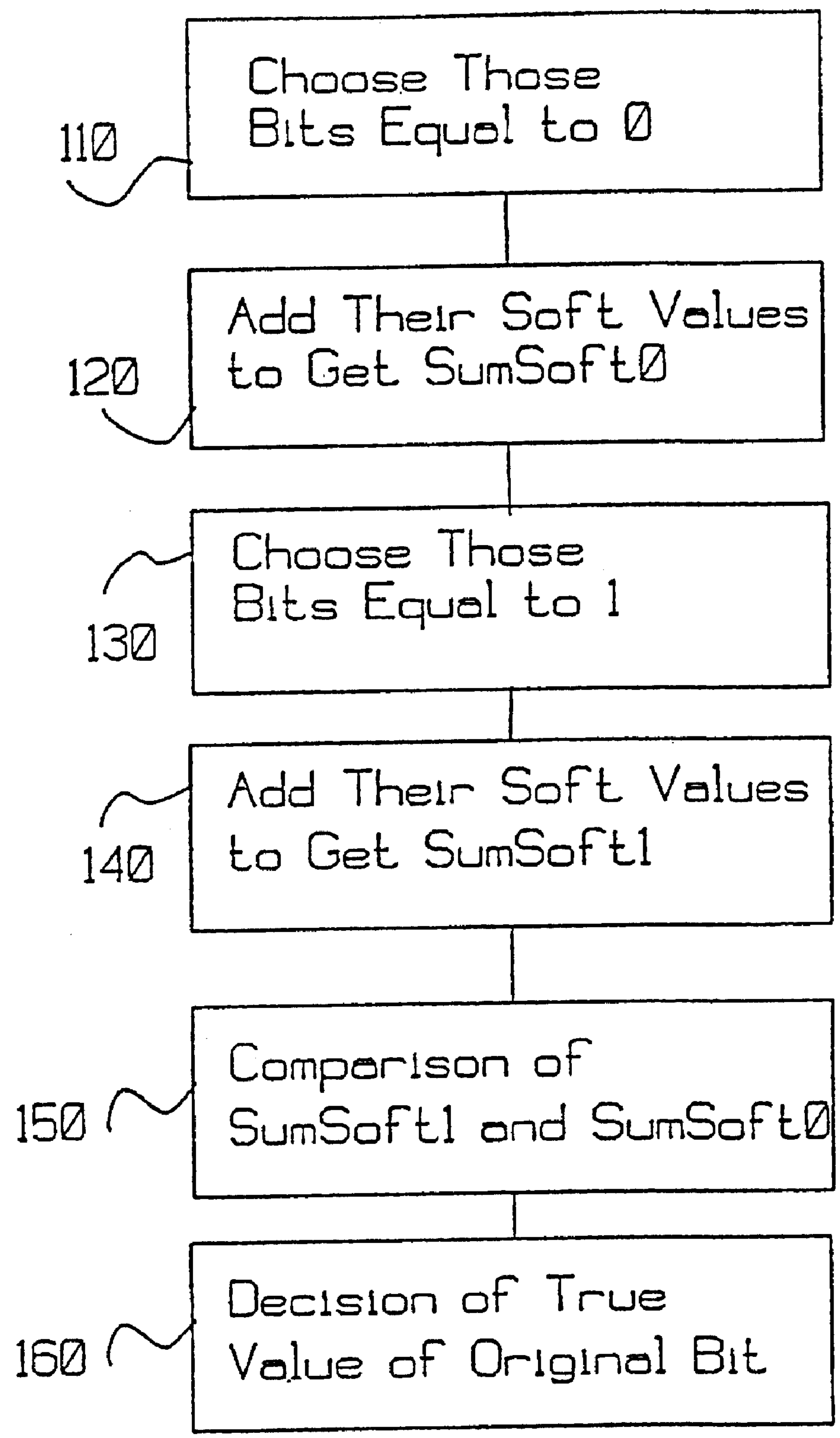
FIG. 1 is a flowchart illustrating the method performed according to the present invention where comparisons are performed between variables SumSoft1 and SumSoft0.

In FIG. 1 is shown a flowchart of the present invention as used in detection of the value of a bit received in a communications system. In certain systems bits are protected by repetition of their values.

In addition, certain systems, such as the GSM system described in more detail below, also have "soft" values for all the received bits. These soft values are a measure of the reliability of the bit received. If the bit is received as a 1, for example, the soft value gives a measure of the probability that the bit is actually a 1. These soft values can be used to increase the efficiency of the use of repeated bits. Normally systems that repeat bits, repeat them an even number of times. This will then give a total odd number of bits from the original bit plus its repetitions. The system will then make a decision as to the value of the original bit transmitted by making a majority decision based on the value of the majority of the original bit and its repetitions.

In FIG. 1 is shown a flowchart of the present invention that takes advantage of the availability of soft values to improve upon this majority decision method. The use of soft values will be described in more detail below in the description of the preferred embodiment detection of pulse5 bits in a GSM system. In the first step 110 of the method as shown in FIG. 1, the bits among those bits to be protected whose values are equal to 0 are chosen. These will be the bits from the original bit and its repetitions. Then the soft values of these bits are added together, step 120, to yield a value called SumSoft0, which will thereby be the sum of the soft values for all the bits equal to 0 among a given bit and its repetitions.

The next step in the present invention is to similarly choose, step 130, the bits from the original and its repetitions whose values are equal to 1. Then the soft values of these bits are added together, step 140, to yield a value called SumSoft1, which will thereby be the sum of the soft values for all the bits equal to 1 among a given bit and its repetitions.

After the values for SumSoft0 and SumSoft1 are determined, a comparison, step 150, between the two is taken and a decision, step 160, is then made as to the value of the original bit transmitted based on the result of this comparison.

Figure 2:
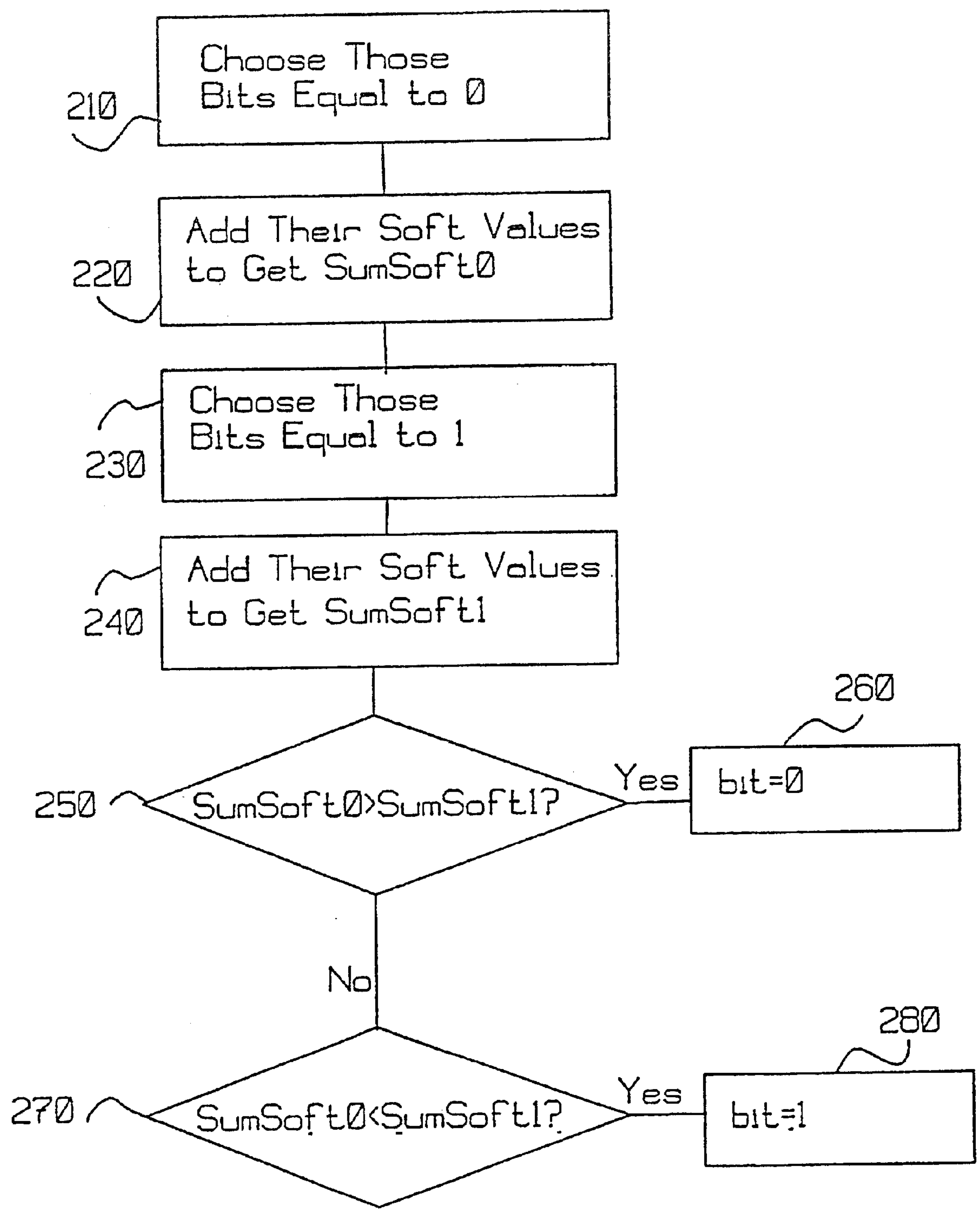
FIG. 2 is a flowchart illustrating the method performed according to the present invention where the comparison of FIG. 1 is performed according to a specific algorithm.

The comparison can be made using a variety of algorithms, however the preferred method is illustrated in FIG. 2. The values for SumSoft0 and SumSoft1 are determined, steps 210–240, corresponding to steps 110–140 in FIG. 1. Then, after the values for SumSoft0 and SumSoft1 are determined, a decision is taken according to the algorithm below:

if SumSoft0>SumSoft1 (step 250) then bit:=0 (step 260)

else if SumSoft0<SumSoft1(step 270) then bit:=1 (step 280).

Figure 3:
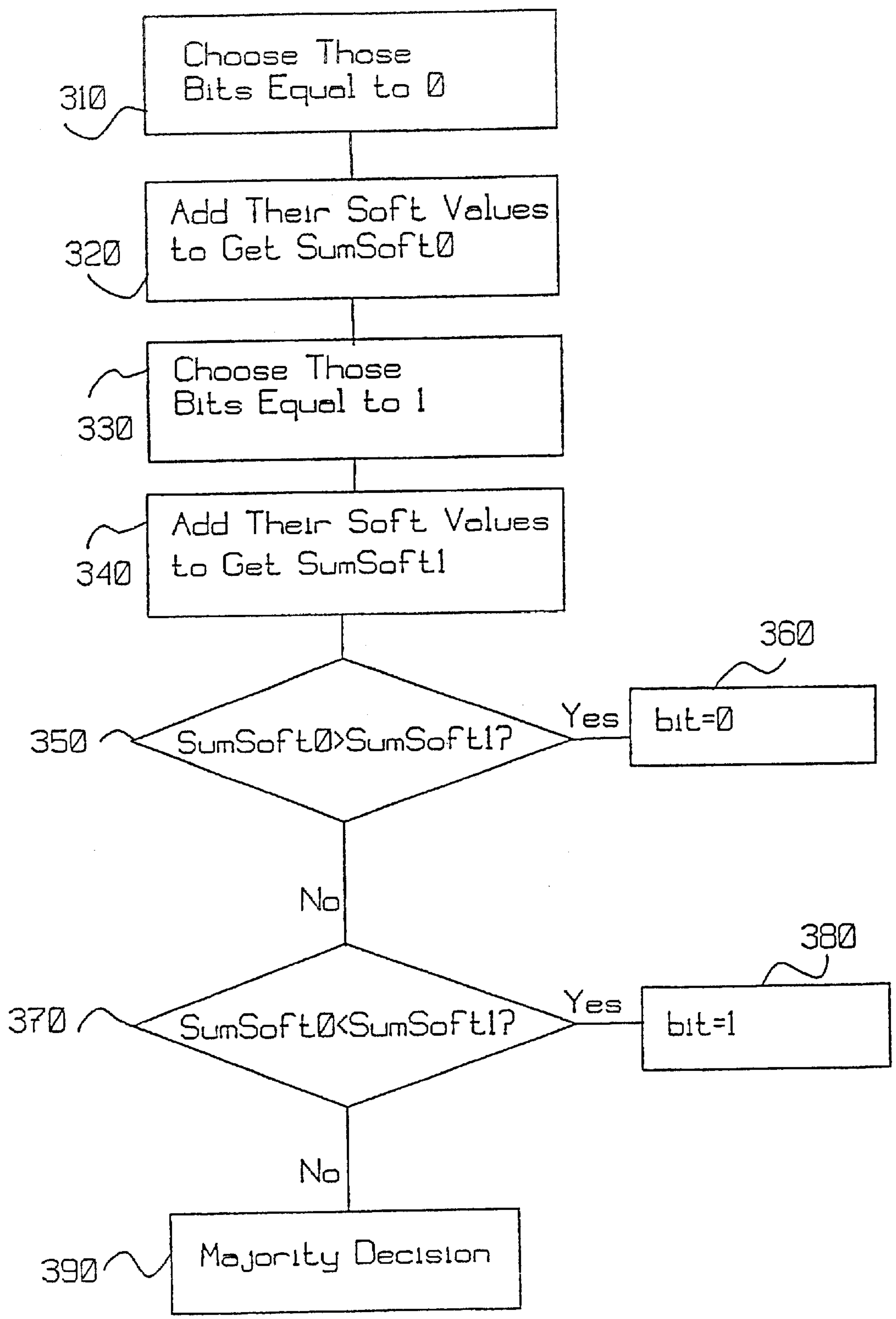
FIG. 3 is a flowchart illustrating the method performed according to the present invention where the total of a bit and its repetitions is odd.

A particular refinement of the ivention can been seen in FIG. 3 The values for SumSoft0 and SumSoft1 are determined, steps 310–340, and a decision is taken according to steps 350–380. It is still possible after step 270 in FIG.2, corresponding to steps 370 in FIG. 3, that it is neither true that SumSoft0<SumSoft1. If an even number of repetition of the original bit were made then an odd number of tal bits is available from the original bit and its repetitions. In this situation a simple majority decision will be made, step 390, among the original bit and its repetitions. For example, suppose the original bit is 0 and there are four repetitions, one equal to 0 and three equal to 1. However, it is neither true that SumSoft0>SumSoft1 or SumSoft0<SumSoft1. Then a simple majority decision will be made among the five bits that the value of the original bit is a 1.

Figure 4:
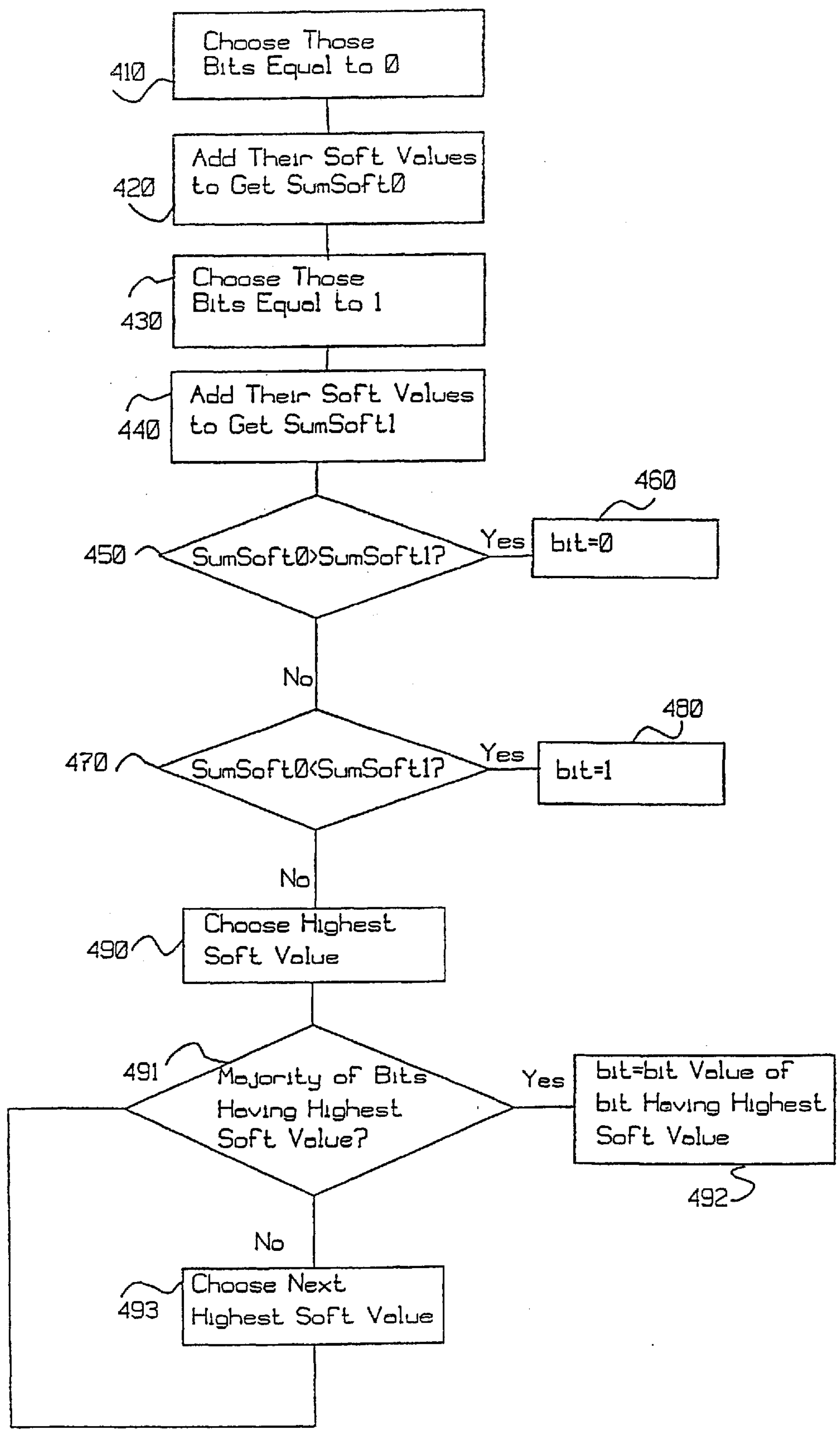
FIG. 4 is a flowchart illustrating the method performed according to the present invention where the total of a bit and its repetitions is even.

In FIG. 4 is illustrated the situation where an odd number of repetitions of the original bit is performed. The values for SumSoft0 and SumSoft1 are determined, steps 410–440, and a decision is taken according to steps 450–490. When there is an odd number of repetitions of the original bit a simple majority decision cannot be performed because the total number of bits, original plus repetitions, is even. Instead, the value of the highest soft value is chosen, step 490. The system then checks, step 491, to see if a majority of Is or 0s has this highest soft value. The value of the original bit transmitted is then chosen, step 492, to be the value of the bit having this highest soft value. For example, if there are two 0s and one 1 all having the same highest soft value, then the system chooses 0 as the value of the original bit.

If an equal number of 1s and 0s have this same highest soft value then the step is repeated, step 493, for the next highest soft value. At some point a soft value will be reached which will have a majority of 1s or 0s among the original bit and its repetitions whose soft values equal this value. The value of the original bit transmitted will then be set, step 492, to be this value.

Figure 5:
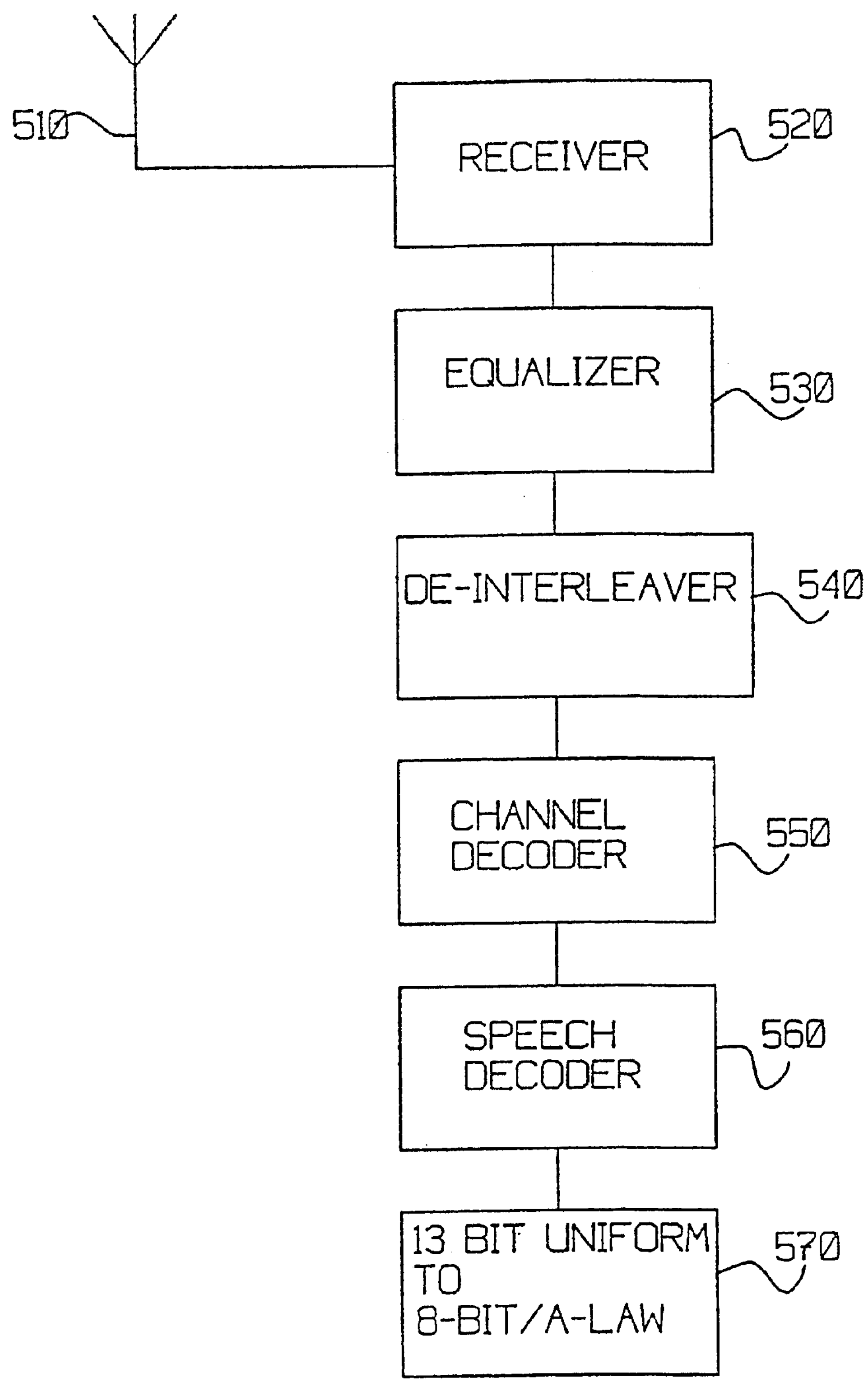
FIG. 5 is a diagram of part of a GSM mobile communications system used in reception of radio signals.

In FIG. 5 is a block diagram illustrating part of a radio receiver system as used in a GSM system. This will illustrate the preferred embodiment of the present invention. An antenna 510 of the receiver 520 of a base station, for instance, receives radio signals over a certain radio channel. The signals (e.g. data, speech) transmitted over this channel may become strongly distorted due to fading, for example, so that the transmitted bursts give rise to a distorted speech frame.

The receiver 520 converts a radio signal to a baseband signal. The receiver 520 then sends this baseband signal to the equalizer 530 where the signal is then demodulated. The equalizer 530 also compensates for the distortion (e.g. multipath propagation, time dispersion, etc.) caused by the radio channel. For example, in GSM a Viterbi equalizer 530 is typically used for this purpose.

"Soft" information is obtained from the equalizer 530 and is a measure of the reliability of each bit. There are several different ways of obtaining "soft" information that gives various measurements of this reliability. For example, the soft values can be obtained in the following way in a system using Trellis decoding. To each state in the Trellis (the Viterbi algorithm is used) two metrics are calculated, $M_0$ and $M_1$. To each state there is also a soft value calculated defined as follows: SoftValue=$|M_0-M_1|$. The used soft values correspond to the decided path in the Trellis.

The equalizer 530 sends the signal to the deinterleaver 540, which reorders the bitstream so that the bitstream is in the same order going into the channel decoder as it was when it originally left the channel encoder.

This signal is then sent to a channel decoder 550 to perform the opposite operation of that performed by the channel encoder on the transmitter side, i.e. to recover transmitted information from the known redundant bits and the known channel coding (e.g. a convolution code).

The decoded speech frames are delivered from the channel decoder 550 to the speech decoder 560, speech-frame by speech-frame, where a complete synthesis of received speech frames is effected so as to deliver speech signals to a converter 570 which converts speech signals from 13-bit uniform PCM to an 8-bit/A-law PCM used in the public-switched telephone network (PSTN).

Figure 6:
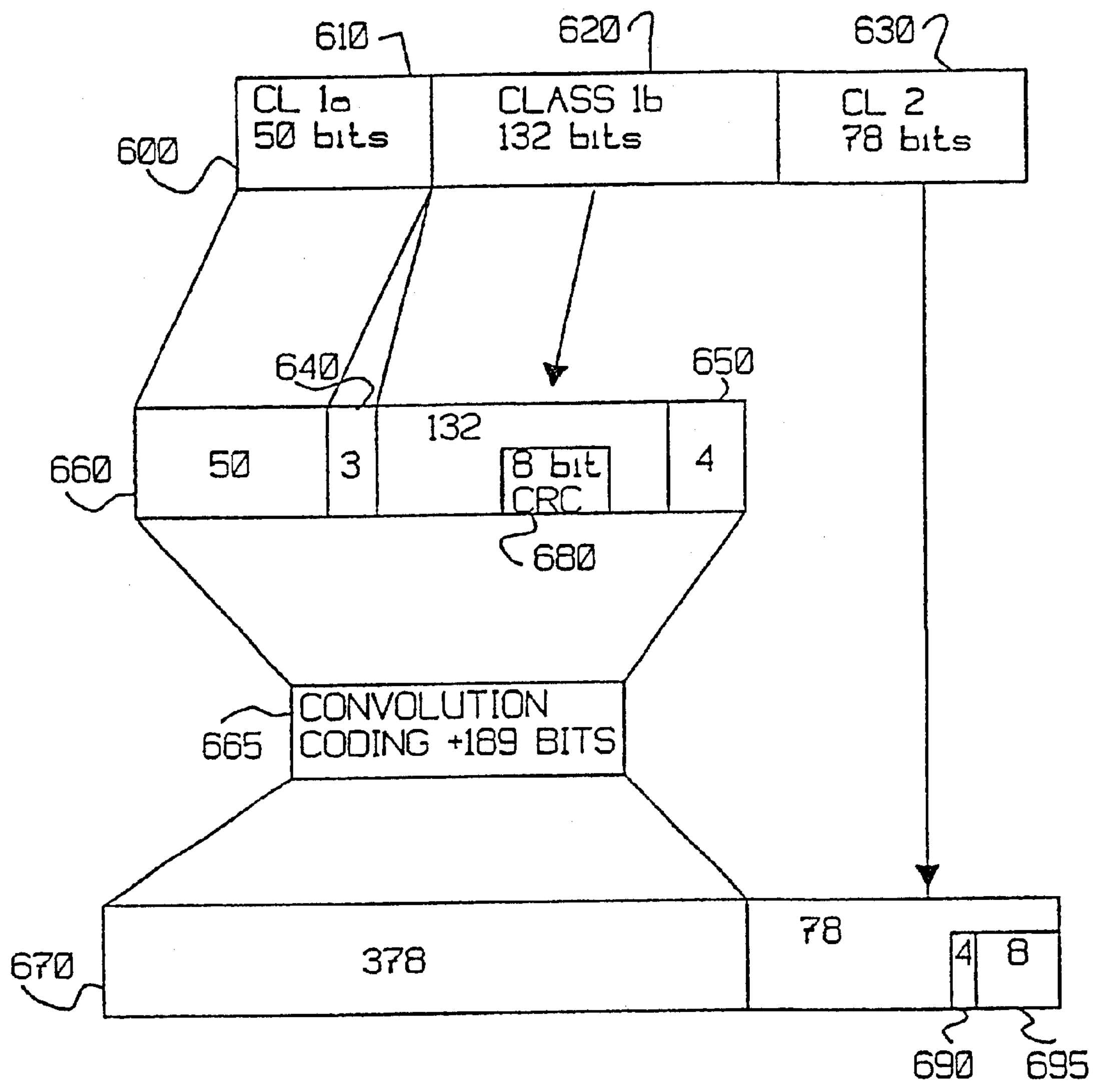
FIG. 6 is a diagram of a GSM enhanced full-rate (EFS) speech frame, and how various bits are allocated among class 1*a*, class 1*b*, and class 2.

In FIG. 6 can be seen a speech frame 600 which contains 260 bits in accordance with the GSM recommendation. The speech frame is divided into three blocks of which each defines one of three different classes. One block of 50 bits is assigned to class 1*a* 610, one block of 132 bits is assigned to class 1*b* 620, and the remaining block of 78 bits is assigned to class 2 630. The 260 bits are delivered from the speech encoder to form the digitized speech after speech encoding. Since a speech frame composed of 260 bits is sent every 20 ms, this gives an effective transmission rate of 13 kbit/s in full rate (FS) transmission. In enhanced full rate (EFS) transmission the relevant speech parameters are coded using only 244 bits, giving a rate of slightly more than 12 kbit/s.

Class 1*a* 610: This block 610 of 50 bits are most sensitive to transmission error and cause the most problematic consequences with regard to the intelligibility of the transmitted and decoded speech. When errors are found in these bits, large parts of the immediately preceding, correct speech frame are repeated. This error detection is performed with the aid of three parity bits 640 which are added to the 50 data bits as control bits.

Class 1*b* 620: This block of 132 bits is not protected by parity bits. Four bits are added as so-called tail bits 650. These 132 bits are not equally as sensitive with regard to the intelligibility to transmission bit errors occurring as compared to the class 1*a* bits.

Both the class 1*a* and 1*b* bits, including the three parity bits and the four tail bits, are grouped together and convolution coded.

Class 2 630: These 78 bits are the bits least susceptible to error and are not protected at all-by additional bits, as in the case of class 1*a* and 1*b*.

These three blocks 610, 620, 630, in a speech frame contain 50+132+78=260 bits, not including the 3 parity and 4 tail bits, which, when added, give a complete total of 267 bits. Of these 267 bits, 53+136=189 bits (see second group 660) are convolution encoded 665 with the rate=½, so a further 189 bits are added. This results in a total of 378+78=456 bits in the final group 670 coming from the channel encoder, which can then be interleaved for inclusion in the TDMA frames.

As mentioned above, in the enhanced full rate (EFS) mode of transmission in GSM there are used only 244 of the 260 bits available due to the greater efficiency of the speech encoding method. This means that there are an additional 16 bits that can be used to protect the other 244 bits. An 8-bit cyclic redundancy check (CRC) 680 is used for error detection among the class 1*b* bits, while the other 8 bits 695 are used to protect a group of class 2 bits known as pulse5 bits 690. These pulse5 bits 690 are not protected with channel coding.

The remaining 8 of 16 bits available in EFS are used to protect the pulse5 bits 690 by repetition 695. There are four pulse5 bits 690 in each speech frame. These four bits 690 are each then duplicated 695, using the 8 free bits and forming a total of twelve pulse5 bits 690, 695.

The pulse5 bits 690 must then be detected. The GSM specification doesn't require a particular detection method for the pulse5 bits, but merely requires that they be repeated. As has been mentioned above, current techniques detect the pulse5 bits by taking the value of each pulse5 bit and the values of its two repetitions. A decision is then taken whereby the value of the pulse5 bit is decided to be the majority of the three values. This is efficient, but not as reliable as possible using the soft values from the equalizer 530, FIG. 5.

As discussed above, the equalizer 530 provides additional information in the form of soft values for each bit, including the pulse5 bits. The present invention makes use of these soft values which provide a measure of the reliability of each bit. In the preferred embodiment the method of the present invention will be implemented in the channel decoder 550, where the soft values for all bits are available. These values are normally used in the channel decoding process.

Figure 7:
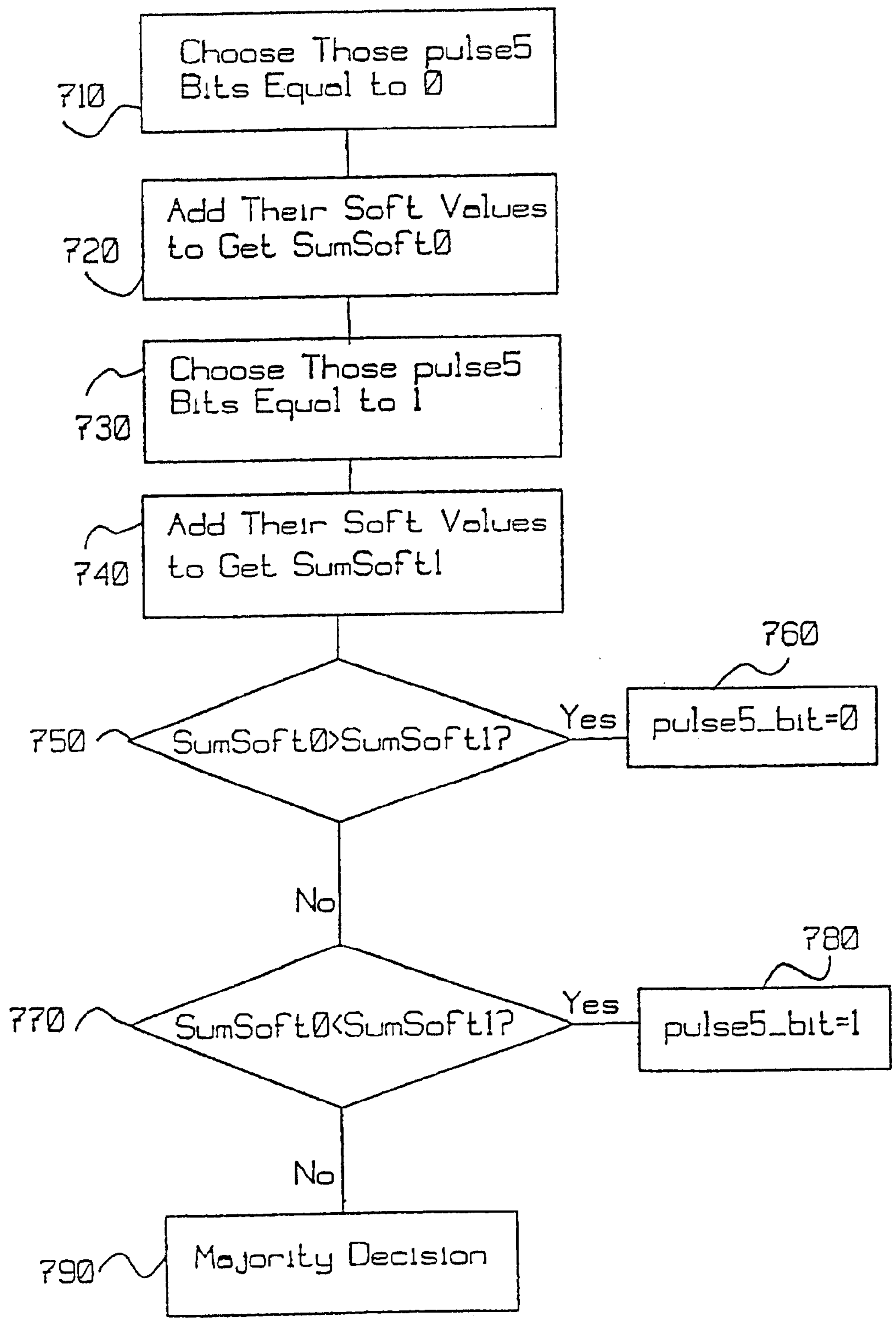
FIG. 7 is a flowchart illustrating the preferred embodiment performed according to the present invention.

For each of four total pulse5 bits there are three soft values, the soft value of the original bit plus the soft values of two repetitions. The equalizer produces a soft value for each of these three bits. In the first step 710 of the method as shown in FIG. 7, the bits whose values are equal to 0 are chosen. Then the soft values of these bits are added together, step 720, to yield a value called SumSoft0, which will thereby be the sum of the soft values for all the bits equal to 0 for a given pulse5 bit.

The next step in the present invention is to similarly choose, step 730, the bits whose values are equal to 1. Then the soft values of these bits are added together, step 740, to yield a value called SumSoft1, which will thereby be the sum of the soft values for all the bits equal to 1 for a given pulse5 bit.

After the values for SumSoft0 and SumSoft1 are determined, a decision is taken according to the algorithm below:

if SumSoft0>SumSoft1 (step 750) then
  pulse5_bit:=0 (step 760)
else if SumSoft0<SumSoft1 (step 770) then
  pulse5_bit:=1 (step 780)
else
  an ordinary majority decision takes place (step 790).

An example of this decision process can be illustrated. Assume that a pulse5 bit is equal to 0 It is repeated to yield three 0s, but when detected two 1s and one 0 result. The soft values from the equalizer give low soft values for the 1s (i.e. low reliability) while it gives a high soft value for the 0 (i.e. a high reliability). The result is that the sum of the soft values for both 1s is still less than the soft value for the 0. Thus, the variable SumSoft0 is greater than the variable SumSoft1 (i.e. SumSoft0>SumSoft1), so that the decision will be taken that the pulse5 bit is equal to 0 (i.e. pulse5_bit:=0).

In this example the existing detection would detect a 1 but the present invention would detect a 0 because the reliability as derived from the soft values was greater than the reliability of a 1.

Figure 8:
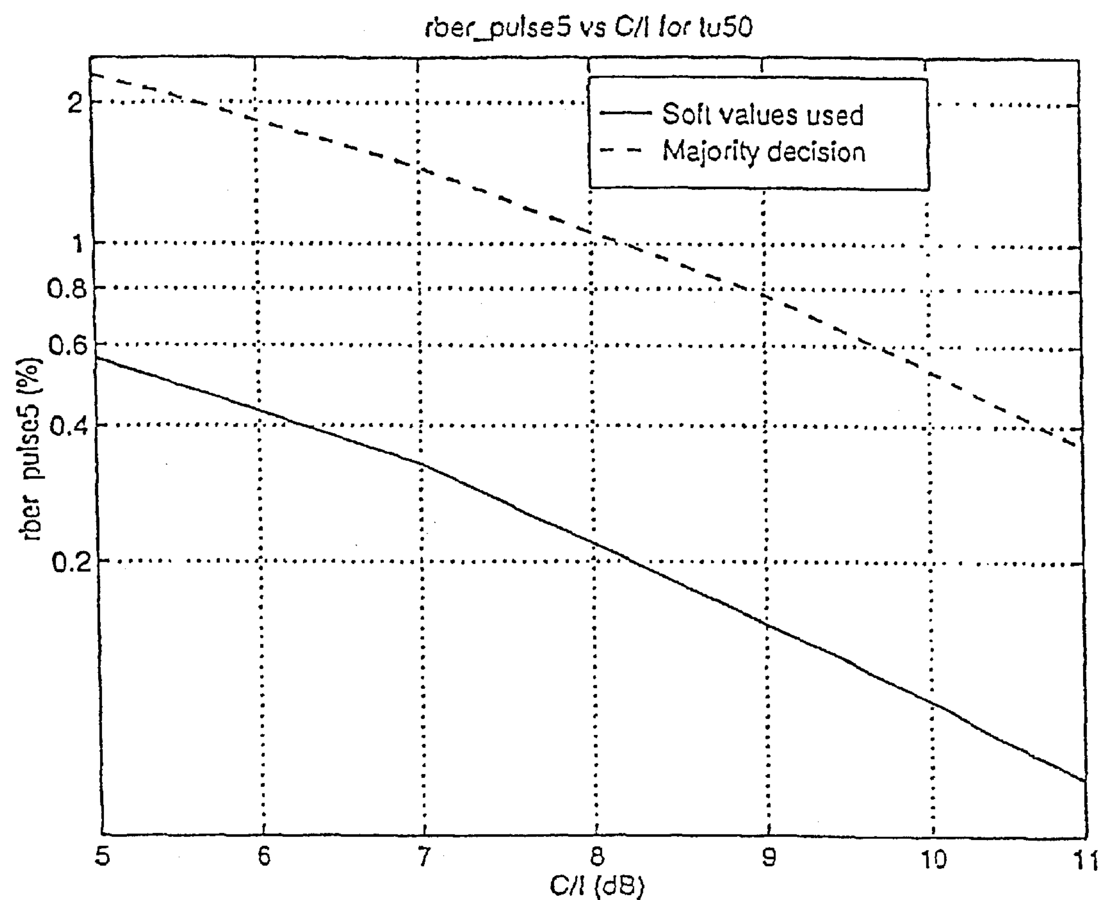
FIG. 8 is a graph illustrating the results of a simulation illustrating the improved performance of the present invention over the prior art in the detection of pulse5 bits in a GSM system.

FIG. 8 shows a result of a simulation comparing the present invention with the prior art method of using a majority decision. It can be seen that the present invention improves the residual bit error for pulse5 bits (rber_pulse5) performance between 3.4 and 4.6 dB, depending on the propagation conditions, and if it is interference or sensitivity that is tested.

The embodiments described above serve merely as illustration and not as limitation. It will be apparent to one of ordinary skill in the art that departures may be made from the embodiments described above without departing from the spirit and scope of the invention. The invention should not be regarded as being limited to the examples described, but should be regarded instead as being equal in scope to the following claims.

What is claimed is:

1. A method of determining a value of a bit received in a transmission in a radio communication system, said bit being repeated at least once In said transmission, said method comprising the steps of:

associating with the received bit and each received repetition of the received bit, a reliability value that is independent of the actual value of the received bit and of the other received repetitions of the bit, said reliability value indicating on a numerical scale, a reliability weighting that is independently assigned to each bit and each bit repetition;

adding together, for the bits and bit repetitions that have actual values equal to 0, the associated reliability weightings of those bits and bit repetitions, thereby yielding a first total reliability weighting;

adding together, for the bits and bit repetitions that have actual values equal to 1, the associated reliability weightings of those bits and bit repetitions, thereby yielding a second total reliability weighting;

performing a comparison of the first total reliability weighting and the second total reliability weighting;

deciding that said actual value of said bit is equal to 0 if the first total reliability weighting is greater than the second total reliability weighting; and deciding that said actual value of said bit is equal to 1 if the first total reliability weighting is less than the second total reliability weighting.

2. The method of claim 1 wherein said radio communication system is a GSM mobile communications system and said bit is a pulse5 bit being repeated twice.

3. A method of determining a value of a bit received in a transmission in a radio communication system, said bit being repeated at least once in said transmission, said bit and its said repetitions having associated soft values, said method comprising the steps of:

adding together the associated soft values of those of said bit and its said repetitions that are equal to 0, thereby yielding a value SumSoft0;

adding together the associated soft values of those of said bit and its said repetitions that are equal to 1, thereby yielding a value SumSoft1;

performing a comparison of said values of SumSoft1 and SumSoft0;

deciding that the value of said bit is equal to 0 if the value of SumSoft0 is greater than the value of SumSoft1;

deciding that the value of said bit is equal to 1 if the value of SumSoft0 is less than the value of SumSoft1; and deciding that the value of said bit is equal to the bit value of the majority of the said bit and its said repetitions if said value of SumSoft0 is equal to said value of SumSoft1.

4. A method of determining a value of a bit received in a transmission in a radio communication system, said bit being repeated at least once in said transmission, said bit and Rs said repetitions having associated soft values, said method comprising the steps of:

adding together the associated soft values of those of said bit and its said repetitions that are equal to 0, thereby yielding a value SumSoft0;

adding together the associated soft values of those of said bit and its said repetitions that are equal to 1, thereby yielding a value SumSoft1;

performing a comparison of said values of SumSoft1 and SumSoft0;

deciding that the value of said bit is equal to 0 if the value of SumSoft0 is greater than the value of SumSoft1;

deciding that the value of said bit is equal to 1 if the value of SumSoft0 is less than the value of SumSoft1; and if said value of SumSoft0 is equal to said value of SumSoft1, selecting the largest of said soft values associated with a majority of bit values equal to either 0 or 1; and deciding that the value of said bit is equal to the bit value represented by said majority of bit values.

5. An apparatus for determining a value of a pulse5 bit received in a transmission in a GSM mobile communications system, said bit being repeated twice in said transmission, said apparatus comprising;

means for associating with the received pulse5 bit and each received repetition of the received bit, a reliability weighting that is independent of the actual value of the received bit and of the other received repetitions of the bit, said reliability weighting indicating on a numerical scale, a reliability weighting that is independently assigned to each bit and each bit repetition:

means for adding together, for the pulse5 bits and bit repetitions that have actual values equal to 0, the associated reliability weightings of those pulse5 bits and bit repetitions, thereby yielding a first total reliability weighting;

means for adding together, for the pulse5 bits and bit repetitions that have actual values equal to 1, the associated reliability weightings of those pulse5 bits and bit repetitions, thereby yielding a second total reliability weighting;

means for comparing the first total reliability weighting and the second total reliability weighting; and means for determining the actual value of the received pulse5 bit based on an output of the comparing means.

6. The apparatus of claim 5, further comprising:

means for selecting the largest of the reliability weightings associated with a majority of bit values equal to either 0 or 1; and means for deciding that the value of the received pulse5 bit is equal to the bit value represented by said majority of bit values.

7. The apparatus of claim 6 wherein one pulse5 bit and one repetition bit are received, and wherein one of the received bits is equal to 0, one of the received bits is equal to 1, and both of the received bits have identical associated reliability weightings equal to said largest reliability weighting, said apparatus further comprising:

means for selecting the second largest of said associated reliability weightings; and means for deciding that the value of said pulse5 bit is equal to the value of the bit having the second largest associated reliability weighting among said associated reliability weightings.

8. The apparatus of claim 5, wherein the means for comparing the first total reliability weighting and the second total reliability weighting includes means for determining whether the first total reliability weighting is greater than the second total reliability weighting, or vice versa, and the means for determining the actual value of the received pulse5 bit includes means for determining the actual value of the received pulse5 bit as being equal to 0 upon determining that the first total reliability weighting is greater than the second total reliability weighting, and for determining the actual value of the received pulse5 bit as being equal to 1 upon determining that the second total reliability weighting is greater than the first total reliability weighting.

9. The apparatus of claim 5, wherein the means for determining the actual value of the received pulse5 bit includes means for determining that the value of the pulse5 bit is equal to the bit value of the majority of the pulse5 bit and its bit repetitions if the value of the first total reliability weighting is equal to the value of the second total reliability weighting.

* * * * *